US006366489B1

United States Patent
Salling

(10) Patent No.: US 6,366,489 B1
(45) Date of Patent: Apr. 2, 2002

(54) BI-STATE FERROELECTRIC MEMORY DEVICES, USES AND OPERATION

(75) Inventor: Craig T. Salling, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,392

(22) Filed: Aug. 31, 2000

(51) Int. Cl.[7] .............................................. G11C 11/22
(52) U.S. Cl. ...................................... 365/145; 365/149
(58) Field of Search ................................. 365/145, 149

(56) References Cited

U.S. PATENT DOCUMENTS

| | | | |
|---|---|---|---|
| 4,888,630 A | 12/1989 | Paterson | 357/23.5 |
| 5,119,329 A | 6/1992 | Evans, Jr. et al. | 365/145 |
| 5,146,299 A | 9/1992 | Lampe et al. | 357/23.5 |
| 5,273,927 A | 12/1993 | Gnadinger | 437/52 |
| 5,289,410 A | 2/1994 | Katti et al. | 365/170 |
| 5,345,414 A | 9/1994 | Nakamura | 365/145 |
| 5,633,821 A | 5/1997 | Nishimura et al. | 365/145 |
| 5,680,344 A | 10/1997 | Seyyedy | 365/145 |
| 5,812,442 A | 9/1998 | Yoo | 365/145 |
| 5,847,989 A | 12/1998 | Seyyedy | 365/145 |
| 5,905,672 A | 5/1999 | Seyyedy | 365/145 |
| 5,907,861 A | 5/1999 | Seyyedy | 711/152 |
| 5,909,389 A | 6/1999 | Kawakubo et al. | 365/145 |
| 5,973,911 A | 10/1999 | Nishioka | 361/313 |
| 5,990,507 A | 11/1999 | Mochizuki et al. | 257/295 |
| 5,999,439 A | 12/1999 | Seyyedy | 365/145 |
| 6,028,784 A | 2/2000 | Mori et al. | 365/145 |
| 6,049,477 A | 4/2000 | Taira | 365/145 |
| 6,067,244 A | 5/2000 | Ma et al. | 365/145 |
| 6,121,642 A | 9/2000 | Newns | 257/192 |
| 6,144,579 A | 11/2000 | Taira | 365/145 |
| 6,281,535 B1 * | 8/2001 | Ma et al. | 257/295 |

* cited by examiner

Primary Examiner—David Nelms
Assistant Examiner—M. Tran
(74) Attorney, Agent, or Firm—Fogg, Slifer & Polglaze, P.A.; Thomas W. Leffert

(57) ABSTRACT

Bi-state ferroelectric-MOS (FMOS) capacitors are adapted for use in memory cells of a memory device. Bi-state ferroelectric memory cells have a bottom plate of a capacitor coupled to a first source/drain region of a pass transistor, a gate of the pass transistor coupled to a word line, and a second source/drain region of the pass transistor coupled to a bit line. A plate line is coupled to the top plate of the capacitor to facilitate programming of the polarization state of a ferroelectric portion of the capacitor. The polarization state of the ferroelectric portion of the capacitor causes a depletion or accumulation of electrons in the bottom plate of the capacitor, thus altering its capacitance value. The resulting capacitance value may be sensed without causing a polarization reversal of the ferroelectric portion of the capacitor. Accordingly, bi-state ferroelectric memory cells of the various embodiments function as non-volatile memory cells.

32 Claims, 14 Drawing Sheets

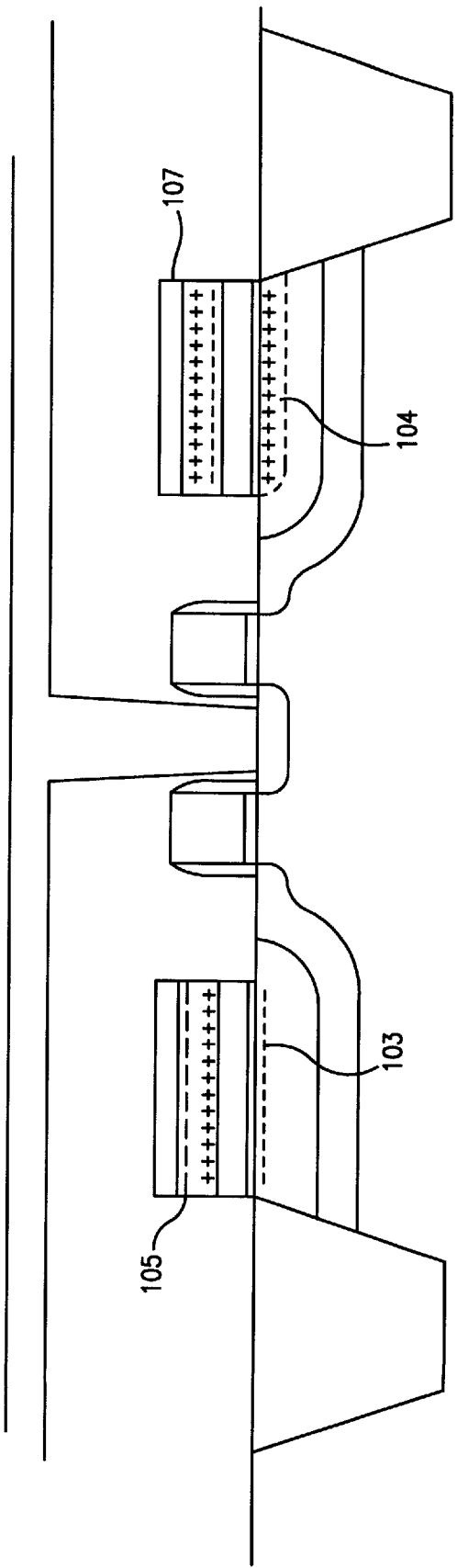
FIG. IE

Reading a "1" cell

Reading a "0" cell

BI-STATE FERROELECTRIC MEMORY DEVICES, USES AND OPERATION

TECHNICAL FIELD OF THE INVENTION

The present invention relates to ferroelectric memory devices, and particularly to memory cells having ferroelectric-MOS capacitors and sensing architectures therefor.

BACKGROUND OF THE INVENTION

Ferroelectric materials are a class of materials that can be thought of as having electrical properties somewhat analogous to the magnetic properties of ferromagnetic materials. A uniaxial ferromagnetic material can be magnetized in one of two directions, and thereafter will retain a magnetic field in that direction even after the applied magnetic field is removed; similarly, a ferroelectric material can be "polarized" in either direction (by applying an electric field to it), and thereafter will retain an electric field in that direction, even after the applied electric field is removed.

Ferroelectric materials have been successfully integrated into integrated circuit processes, but this integration can have some drawbacks. Ferroelectric materials having sufficient thermal stability for integrated circuit processing often include incompatible metals that must be separated from a silicon substrate. Such ferroelectric materials also tend to be strong oxygen sources, increasing the risk of undesirable oxidation of adjacent materials. Additionally, ferroelectric materials generally can only withstand a finite number of polarization reversals before their performance degrades.

Ferroelectric memories exploit the properties of ferroelectric materials. These materials are useful in semiconductor memories as they have characteristics to provide a non-volatile memory function; after a ferroelectric material has been polarized in one direction, it will hold that polarization for an extended time without further power input. In contrast, dynamic random access memory (DRAM) requires periodic refresh to maintain its data value, thus losing its data value upon the removal of its power source.

Since the physics of ferroelectric memories are different from those of conventional memory types (such as typical DRAM, Static RAM, or floating gate memories), the sensing operation is correspondingly different. Similar to DRAM, which generally stores its data value as a charge in a capacitor, a typical ferroelectric memory may also store its data value in a capacitor. However, while DRAM sense a stored charge of the capacitor to determine the data value, ferroelectric memories sense the polarization of the capacitor dielectric.

Ferroelectric memories are commonly sensed by pumping charge into the ferroelectric capacitor. If this operation forces the ferroelectric material to change its state, this can be detected by monitoring the amount of charge that subsequently exits the capacitor. Note that this procedure may be a destructive read in that a reversal of polarity may occur as a result of the read operation, thus requiring the data to be rewritten to the memory cell. This cumbersome operation is not only undesirable from the standpoint of time needed to read and rewrite, but may require the use of more than one transistor, or even more than one capacitor. Also, as noted previously, the ferroelectric material has an upper limit on the number of times the polarity can be changed without degradation. Accordingly, such destructive reads reduce the useful life of the memory device.

At the microscopic scale, the ferroelectric material can be seen to be divided into domains. A domain is a volume within which the polarization of the material is uniform. Each domain can have only two stable polarization states. The magnitude of the polarization state of the bulk material is a composite of the individual domain polarization states.

FIG. 6 schematically shows a typical hysteresis curve for a ferroelectric material. When the applied electric field E is increased to a positive value $E_1$, the polarization of the material will increase to a value $P_1$. When the applied positive field is subsequently removed, the polarization will fall back to a positive "remanent polarization" value $P_r$. In a similar manner, when the applied electric field is increased in the opposite direction, to a negative value $-E_2$, the polarization of the material will go to a negative value $-P_2$. When the applied negative field is subsequently removed, the polarization will fall back to a negative remanent polarization value $-P_r$. Thus, the material can take either of two polarization states in the absence of an electric field, depending on how it has been affected by the previously applied field. For electrical circuit analysis, the polarization state of a ferroelectric film can be thought of in terms of surface charge density, i.e., as amount of charge per unit area (usually written as "$\sigma$").

FIG. 7 shows a simplified curve that demonstrates the expected behavior of a ferroelectric bi-state capacitor. The ferroelectric material will reach the extreme values shown during programming, but fall back to the standby state, as shown, after programming. When an increasingly strong electric field is applied to a ferroelectric material, more and more of the domains will change their state to line up with the applied field. The electric field seen by any one domain is affected by the polarization states of the other domains which are nearby. Consequently, a full reversal of polarization requires not only some threshold energy level, but also some delay as individual domains align. This is inconvenient for ferroelectric memories, since it limits the write speed of any such memory. Moreover, in memories that use a destructive read, this phenomenon is also an important constraint on read access time. This has been a problem with commercialization of ferroelectric memories, since it is highly desirable for ferroelectric memories to have access times approximately as fast as those for DRAM memories.

For the reasons stated above, and for other reasons stated below that will become apparent to those skilled in the art upon reading and understanding the present specification, there is a need in the art for alternate architecture and methods of operation of ferroelectric semiconductor memory devices.

SUMMARY OF THE INVENTION

The above-mentioned problems with memory devices and other problems are addressed by the present invention and will be understood by reading and studying the following specification.

Bi-state ferroelectric-MOS (FMOS) capacitors are described herein with specific reference to their use in ferroelectric memory cells. Bi-state ferroelectric memory cells have a bottom plate of a capacitor coupled to a first source/drain region of a pass transistor, a gate of the pass transistor coupled to a word line, and a second source/drain region of the pass transistor coupled to a bit line. The capacitor has a ferroelectric portion. A plate line is coupled to the top plate of the capacitor to facilitate programming of the polarization state of the ferroelectric portion of the capacitor. The polarization state of the ferroelectric portion of the capacitor causes a depletion or accumulation of electrons in the bottom plate of the capacitor, thus altering its capacitance value. The resulting capacitance value may be sensed without causing a polarization reversal of the ferroelectric portion of the capacitor. Accordingly, bi-state ferroelectric memory cells of the various embodiments function as non-volatile memory cells.

The capacitance value of each capacitor can be directly sensed without a significant change in the DC bias across each ferroelectric layer. These sensing operations can thus be carried out without disturbing the polarization state of the ferroelectric layer of the capacitor. Memory cells of the various embodiments thus assist in performing fast read operations using conventional DRAM-type sense architectures. Such structures further facilitate performing non-destructive read operations.

For one embodiment, the invention provides a memory cell. The memory cell includes a pass transistor. The pass transistor has a gate formed overlying a substrate, a first source/drain region formed in the substrate and a second source/drain region formed in the substrate. The memory cell further includes a capacitor. The capacitor has a bottom capacitor plate at least a portion of which is formed in the substrate and coupled to the first source/drain region, a first dielectric layer formed overlying the bottom capacitor plate, a ferroelectric dielectric layer formed overlying the first dielectric layer, and a top capacitor plate formed overlying the ferroelectric dielectric layer. For a further embodiment, the capacitor further includes an intermediate capacitor plate formed between the first dielectric layer and the ferroelectric dielectric layer.

For another embodiment, the invention provides a memory cell. The memory cell includes a pass transistor. The pass transistor has a gate formed overlying a substrate, a first source/drain region formed in the substrate and a second source/drain region formed in the substrate. The memory cell further includes a capacitor. The capacitor has a bottom capacitor plate formed in the substrate, a first dielectric layer formed overlying the bottom capacitor plate, a ferroelectric dielectric layer formed overlying the first dielectric layer, and a top capacitor plate formed overlying the ferroelectric dielectric layer. The bottom capacitor plate has a low conductivity region formed within a high conductivity region. The high conductivity region of the bottom capacitor plate is coupled to the first source/drain region of the pass transistor.

For yet another embodiment, the invention provides a memory cell. The memory cell includes a pass transistor. The pass transistor has a gate formed overlying a substrate, a first source/drain region formed in the substrate and a second source/drain region formed in the substrate. The memory cell further includes a capacitor. The capacitor has a bottom capacitor plate, a first dielectric layer formed overlying the bottom capacitor plate, a ferroelectric dielectric layer formed overlying the first dielectric layer, and a top capacitor plate formed overlying the ferroelectric dielectric layer. The bottom capacitor plate has a high conductivity region formed in the substrate and a low conductivity region formed overlying and in contact with the high conductivity region. The high conductivity region of the bottom capacitor plate is coupled to the first source/drain region of the pass transistor.

For still another embodiment, the invention provides a memory cell. The memory cell includes a pass transistor. The pass transistor has a gate formed overlying a silicon substrate of a first conductivity type, a first source/drain region of a second conductivity type formed in the silicon substrate and a second source/drain region of the second conductivity type formed in the silicon substrate. The second conductivity type is opposite the first conductivity type. The memory cell further includes a capacitor. The capacitor has a bottom capacitor plate at least a portion of which is formed in the silicon substrate, a first dielectric layer formed overlying the bottom capacitor plate, a ferroelectric dielectric layer formed overlying the first dielectric layer, and a top capacitor plate formed overlying the ferroelectric dielectric layer. The bottom capacitor plate has a first region coupled to a second region. The second region is formed in the substrate. The first region of the bottom capacitor plate is doped to the second conductivity type at a first dopant concentration. The second region of the bottom capacitor plate is coupled to the first source/drain region of the pass transistor and is doped to the second conductivity at a second dopant concentration, the second dopant concentration being higher than the first dopant concentration.

The invention further includes a method of forming a memory cell. The method includes forming a gate of a pass transistor overlying a substrate having a first conductivity type and forming first and second source/drain regions in the substrate and adjacent the gate of the pass transistor. The first and second source/drain regions have a second conductivity type opposite the first conductivity type. The method further includes forming a bottom capacitor plate having the second conductivity type, wherein at least a portion of the bottom capacitor plate is formed in the substrate and is coupled to the first source/drain region. The method still further includes forming a first dielectric layer overlying the bottom capacitor plate as a non-sacrificial layer, forming an intermediate capacitor plate overlying the first dielectric layer, forming a ferroelectric dielectric layer overlying the intermediate capacitor plate, and forming a top capacitor plate overlying the ferroelectric dielectric layer.

For a still further embodiment, the invention provides a method of reading a ferroelectric memory cell. The method includes precharging a reference bit line to a first potential and precharging a sensing bit line to a second potential. The second potential is higher than the first potential and the memory cell is coupled to the sensing bit line. The method further includes isolating the precharged reference and sensing bit lines then coupling a capacitor of the memory cell to the sensing bit line. The capacitor contains a ferroelectric dielectric layer. A potential difference across the capacitor after coupling is below a polarization reversal threshold level for the ferroelectric dielectric layer. The method still further includes decoupling the capacitor of the memory cell from the sensing bit line and sensing a potential difference between the reference bit line and the sensing bit line.

The invention further provides apparatus, systems and methods of various scope.

BRIEF DESCRIPTION OF THE DRAWINGS

FIG. 1E is a cross-sectional view showing charge conditions in the bottom plate of the capacitor for first and second states of the memory cells of FIG. 1D.

DETAILED DESCRIPTION OF THE INVENTION

Figure 1A:
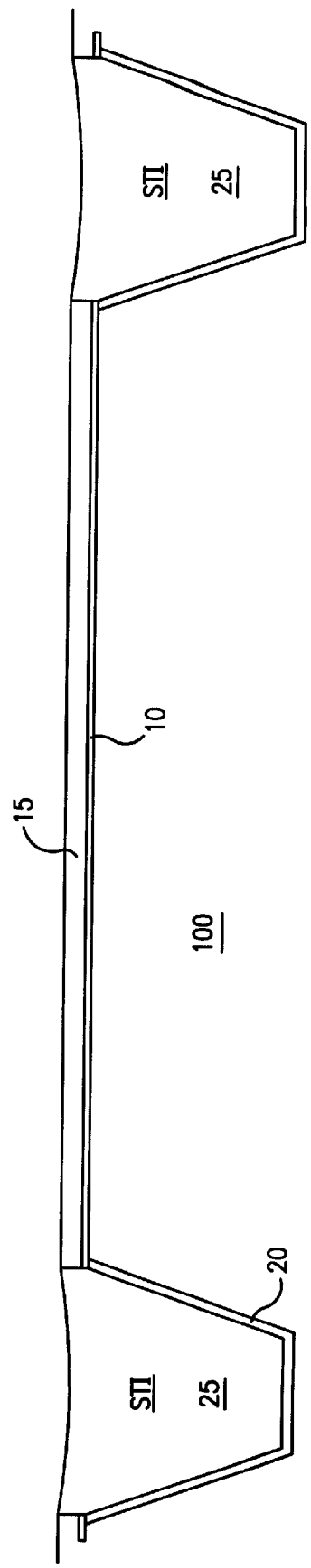
FIGS. 1A–1D are cross-sectional views of memory cells at various stages in heir fabrication in accordance with one embodiment of the invention.

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Memory cells in accordance with various embodiments of the invention include a ferroelectric-MOS (FMOS) capacitor in series with a transistor. The FMOS capacitors of the various embodiments include a ferroelectric (FE) portion and a MOS portion in series. Although the MOS term was originally used to designate metal-oxide-semiconductor devices, it is more generally used today to designate any conductor-dielectric-semiconductor device.

The FE portion of the capacitor includes an FE dielectric material. The fabrication of the structures of the various example embodiments are demonstrated using silicon MOS technology. The memory cells of the example embodiments are fabricated on a p-type substrate. However, as noted above, other substrates may be used for integrated circuit fabrication. Furthermore, the various embodiments could similarly be fabricated on an n-type substrate, using appropriate changes in dopants and control signals. Additionally, various components of the memory cells may be fabricated in an order different from the example embodiments while still producing a memory cell in accordance with the invention.

FIGS. 1A–1D are cross-sectional views of bi-state FE memory cells at various stages in their fabrication in accordance with one embodiment of the invention. Looking first at FIG. 1A, a protective oxide 10 is formed overlying a silicon wafer 100, such as a wafer of monocrystalline silicon having a [100] orientation. The protective oxide 10 may be formed through thermal or other oxidation technique. As an example, the wafer 100 may be placed in an oxygen-containing ambient at approximately 900° C. to grow the protective oxide 10. Other methods of forming the protective oxide 10 include physical vapor deposition (PVD) and chemical vapor deposition (CVD) as is known in the art of integrated circuit fabrication. For one embodiment, the protective oxide 10 is preferably approximately 140–260 Å (most preferably approximately 200 Å) thick. The wafer 100 is doped, such as with a boron implant followed by an anneal, to produce a p-type substrate for this embodiment.

A layer of nitride 15, generally silicon nitride, is formed overlying the protective oxide 10. The layer of nitride 15 may be formed by CVD or other method, e.g., PVD. For one embodiment, the layer of nitride 15 has a thickness of preferably approximately 1200–3000 Å (most preferably approximately 2000 Å).

To permit closer packing of memory cells, isolation regions may be formed between adjacent memory cells. For one embodiment, shallow trench isolation may be used. For this embodiment, the layer of nitride 15, the protective oxide 10, and the wafer 100 are patterned to expose and define portions of the wafer 100 for future isolation regions. Patterning can include use of standard photolithographic techniques. As an example, a layer of photoresist may be deposited overlying the layer of nitride 15, exposed with an energy source, and developed to expose portions of the layer of nitride 15 for the future isolation regions. Material is then removed from the exposed portions, including the exposed portions of the layer of nitride 15, exposed portions of the protective oxide 10, and exposed portions of the wafer 100. Such removal may typically include chemical or ion etching. Sufficient material is removed to form trenches in the wafer 100. For one embodiment, the trench has a depth of approximately 0.35–0.65 μm (preferably approximately 0.5 μm). The resist is then removed, such as by plasma etch.

A layer of oxide 20 or other insulator may be formed in the trench. As one example, the wafer 100 is placed in an oxygen-containing ambient at approximately 900° C. to grow the layer of oxide 20. The layer of oxide 20 has a thickness of preferably approximately 150–230 Å (most preferably approximately 200 Å) on the inside of the trench. The trenches are then filled with an insulative fill material 25. For one embodiment, the insulative fill material 25 is silicon dioxide. As an example, the precursor tetraethylorthosilicate (TEOS) may be used to deposit silicon dioxide by CVD. The insulative fill material 25 preferably has a thickness of approximately 7000–13000 Å (most preferably 10000 Å), thus overfilling the trenches. The wafer 100 is then planarized to remove excess insulative fill material 25. Planarization may be accomplished through such techniques as chemical-mechanical planarization (CMP). The resulting structure is shown in FIG. 1A.

Following formation of the isolation regions, the layer of nitride 15 is removed. A wet etch, such as hot $H_3PO_4$, may be used to remove the layer of nitride 15. The surface of the wafer 100 is then conditioned to set the $V_t$ of the future transistors of the memory cell. As an example, the wafer 100 may be subjected to a boron implant at approximately 20 keV. The wafer 100 is then patterned to expose portions of the surface where the capacitors of the memory cells will be fabricated. The exposed portions are then conductively doped to have an n-type conductivity, or a conductivity type opposite that of the substrate. The resulting structure includes a depletable region (such as an $n^-$ well 26) formed within a conductive region (such as an $n^+$ well 28) as the bottom capacitor plate of the capacitor.

The bottom capacitor plate should generally have the high impurity or high conductivity portion, e.g., $n^+$ well 28, to provide good electrical communication with the source/drain region of the pass transistor of the memory cell and to provide good electrical isolation from the p-type substrate. The bottom capacitor plate should further have the low impurity or low conductivity portion, e.g., $n^-$ well 26, to increase the width of the depletion region. The width of a depletion region will depend on the dopant concentrations in the substrate (narrower at higher concentrations), and on the applied voltage (wider at higher voltages). Since the width of the depletion region varies with applied voltage, the overall capacitance will also vary with applied voltage.

For one embodiment, the $n^-$ well 26 and the $n^+$ well 28 are formed using a low-energy $n^-$ implant and a high-energy $n^+$ implant. For another embodiment, a single high-energy $n^+$ implant forms both wells 26 and 28, such as in a typical retrograde well formation. For a further embodiment, the dopant concentration of the $n^-$ well 26 is approximately $10^{17}$–$10^{19}$ atoms/cm$^3$ (preferably a approximately $10^{18}$ atoms/cm$^3$). The dopant concentration of the $n^+$ well 28 is higher than the dopant concentration of the $n^-$ well 26, preferably by at least approximately one or more orders of magnitude. Subsequent to forming the $n^-$ well 26 and the $n^+$ well 28, the resist is removed, such as by plasma etch, and the protective oxide 10 is removed, such as by stripping with HF.

Following formation of the bottom capacitor plate, a gate dielectric layer 30 is formed on exposed surface areas of the wafer 100. For one embodiment, the gate dielectric layer 30 is an oxide. The oxide may again be formed by thermal or other oxidation technique as described above. For another embodiment, the gate dielectric layer 30 has a thickness of approximately 70–120 Å (preferably approximately 100 Å). Other dielectric materials may be used for the gate dielectric layer 30. Specific examples include silicon oxides, silicon nitrides and silicon oxynitrides.

Figure 1B:
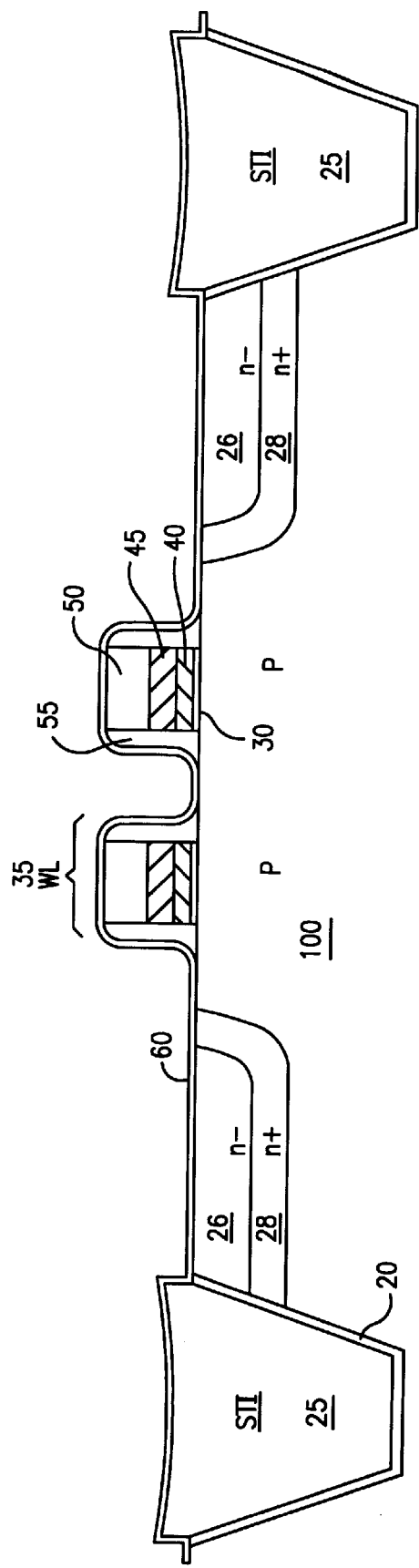

Following formation of the gate dielectric layer 30, word lines 35 are formed, which include the gates of the pass transistors of the memory cells. The word lines 35 are coupled to rows of memory cells of a memory array. Fabrication of word lines 35 is well known and generally includes a conductor formed overlying the gate dielectric layer 30. The following example describes the formation of a typical two-layer word line stack, although other word line stacks may be used. For this embodiment, a conductively-doped polysilicon layer 40 may be formed overlying the gate dielectric layer 30. The polysilicon layer 40 has an n-type conductivity for this embodiment. The polysilicon layer 40 may be formed by such techniques as CVD, preferably to a thickness of approximately 350–650 Å (most preferably approximately 500 Å). A metal silicide layer 45, such as tungsten silicide ($WSi_2$), may be formed overlying the polysilicon layer 40. The metal silicide layer 45 may be formed by such techniques as CVD, preferably to a thickness of approximately 700–1300 Å (most preferably approximately 1000 Å). A cap layer 50 is generally formed overlying the conductive layers (polysilicon layer 40 and metal silicide layer 45) of the word line stack to act as an insulator and barrier layer. The cap layer 50 contains an insulator and may include such insulators as silicon oxide, silicon nitride, and silicon oxynitrides. For one embodiment, the cap layer 50 is silicon nitride, formed by such methods as CVD and having a thickness of preferably approximately 1500–2500 Å (most preferably approximately 2000 Å). The gate dielectric layer 30, the polysilicon layer 40, the metal silicide layer 45, and the cap layer 50 are then patterned to define the word lines 35. The sidewalls of the word lines 35 are then insulated using sidewall spacers 55 preferably having a thickness of approximately 100–200 Å. The sidewall spacers 55 contain an insulator and may include the same materials as the cap layer 50. The sidewall spacers 55 are typically formed by blanket depositing an insulating layer, such as a layer of silicon nitride, over the entire structure and then anisotropically etching the insulating layer to preferentially remove the horizontal regions and the leave only the vertical regions adjacent the sidewalls of the gates. While FIG. 1B shows just two word lines 35, a typical array of memory cells will include word lines over each isolation region for memory cells in adjacent columns. For clarity, these additional word lines are not shown in FIG. 1B.

Following formation of the word lines 35, a first dielectric layer 60 is formed overlying at least a portion of the bottom capacitor plate. The first dielectric layer 60 is a non-ferroelectric material for one embodiment. For a further embodiment, the first dielectric layer 60 is silicon nitride. For a still further embodiment, the first dielectric layer 60 is formed by blanket depositing silicon nitride as shown in FIG. 1B. For one embodiment, the first dielectric layer 60 is silicon nitride formed by PVD, such as jet vapor deposition, to a thickness of preferably approximately 20–60 Å (most preferably approximately 40 Å). Other dielectric materials may be used for the first dielectric layer 60. The first dielectric layer 60 provides electrical isolation between the bottom capacitor plate, and thus the semiconductor substrate, and subsequent overlying layers, such as the subsequent intermediate capacitor plate. The first dielectric layer 60 is non-sacrificial, thus maintaining its conduction-inhibiting state in contrast to some prior art devices. See, e.g., U.S. Pat. No. 5,273,927 issued Dec. 28, 1993 to Gnadinger.

Subsequent formation of the capacitors includes formation of an intermediate capacitor plate. The intermediate capacitor plate will have the first dielectric layer 60 on one side and an FE dielectric layer on the other side. As such, the intermediate capacitor plate may require multiple layers to provide adhesion to each dielectric layer and to provide barrier properties for the ferroelectric material. For one embodiment, the intermediate capacitor plate includes a first conductive layer, such as a conductively-doped polysilicon layer 65, and a second conductive layer, such as first barrier metal layer 70. The first barrier metal layer 70 acts as a barrier layer to inhibit interaction between the subsequent ferroelectric layer and one or more underlying layers, such as the bottom capacitor plate. The polysilicon layer 65 may be an n-type polysilicon blanket deposited using CVD to a thickness of preferably approximately 350–650 Å (most preferably approximately 500 Å). The first barrier metal layer 70 may be a platinum layer formed by PVD, such as sputter deposition, to a thickness of approximately 350–650

Å (most preferably approximately 500 Å). The choice of material(s) for the intermediate capacitor plate is dependent upon the material properties of the first dielectric layer 60 and the subsequent ferroelectric material in light of the foregoing guidelines.

The FE dielectric layer 75, or second dielectric layer, is formed overlying the intermediate capacitor plate, e.g., polysilicon layer 65 and first barrier metal layer 70. For one embodiment, the FE dielectric layer 75 is a metal oxide, such as strontium bismuth tantalite ($SrBi_2Ta_2O_9$; SBT). Other metal oxides having ferroelectric properties may be used for the FE dielectric layer 75. Some examples include lead zirconium titanate (PZT), lanthanum-doped PZT (PLZT), lithium niobate (LiNbO3), or additional metal oxides having a perovskite crystalline structure. The metal oxide may be formed by such techniques as metal organic decomposition. For one embodiment, the FE dielectric layer 75 is deposited to a thickness of approximately 500–2000 Å (most preferably approximately 1000 Å). For a further embodiment, the intermediate capacitor plate is eliminated for cases where the first dielectric layer 60 is compatible with the FE dielectric layer 75, such that the FE dielectric layer 75 is overlying and adjoining the first dielectric layer 60.

A top capacitor plate is formed overlying the FE dielectric layer 75. For one embodiment, the top capacitor plate includes a second conductive barrier layer, such as second barrier metal layer 80. For a further embodiment, the second barrier metal layer 80 is platinum formed by PVD, such as sputter deposition, to a thickness of preferably approximately 350–650 Å (most preferably approximately 500 Å). The first dielectric layer 60, the polysilicon layer 65, the first barrier metal layer 70, the FE dielectric layer 75 and the second barrier metal layer 80 are subsequently patterned to define the capacitors of the memory cells. A protective layer 85 is deposited to protect the capacitor. For one embodiment, the protective layer 85 is a blanket-deposited silicon nitride. Source/drain regions 62 and 63 are formed adjacent the word lines 35. The edges of the source/drain regions 62 and 63 are made to coincide with, or underlap, the gate edges. As an example, the source/drain regions 62 and 63 may be formed using angled implants or post-implant anneals to contact the channel region of the word lines 35. Source/drain regions 62 and 63 may be formed, for example, using $n^+$ implants. Thus, the source/drain regions 62 and 63 have a doping level, and thus a conductivity level, significantly higher than that of the $n^-$ well 26 of the bottom capacitor plate. Source/drain regions 62 and 63 may be formed before or after formation of the protective layer 85.

While the definition of the capacitor in the foregoing description is performed in a single patterning step, the layers may be individually patterned. For one embodiment, the first dielectric layer 60, the polysilicon layer 65, and the first barrier metal layer 70 are patterned prior to formation of the FE dielectric layer 75. The FE dielectric layer 75 is then patterned to have a width less than the width of the previous layers. Such a structure can provide additional diffusion barrier characteristics upon formation of the second barrier metal layer 80; the second barrier metal layer 80 can overlie both the surface and sidewalls of the FE dielectric layer 75.

A first bulk insulator layer 90A is formed overlying protective layer 85. The first bulk insulator is generally an insulating material. Examples include silicon oxides, silicon nitrides, and silicon oxynitrides. For one embodiment, the first bulk insulator layer 90A is a silicon oxide formed using CVD with a TEOS precursor to a thickness of preferably approximately 1800–4800 Å (most preferably approximately 3000 Å). In general, the thickness of the first bulk insulator layer 90A should be equal to or larger than the thickness of the word lines 35, for embodiments where the top of the capacitor is below the top of the word lines 35, to facilitate subsequent planarization without disturbing the word lines 35.

Figure 1C:
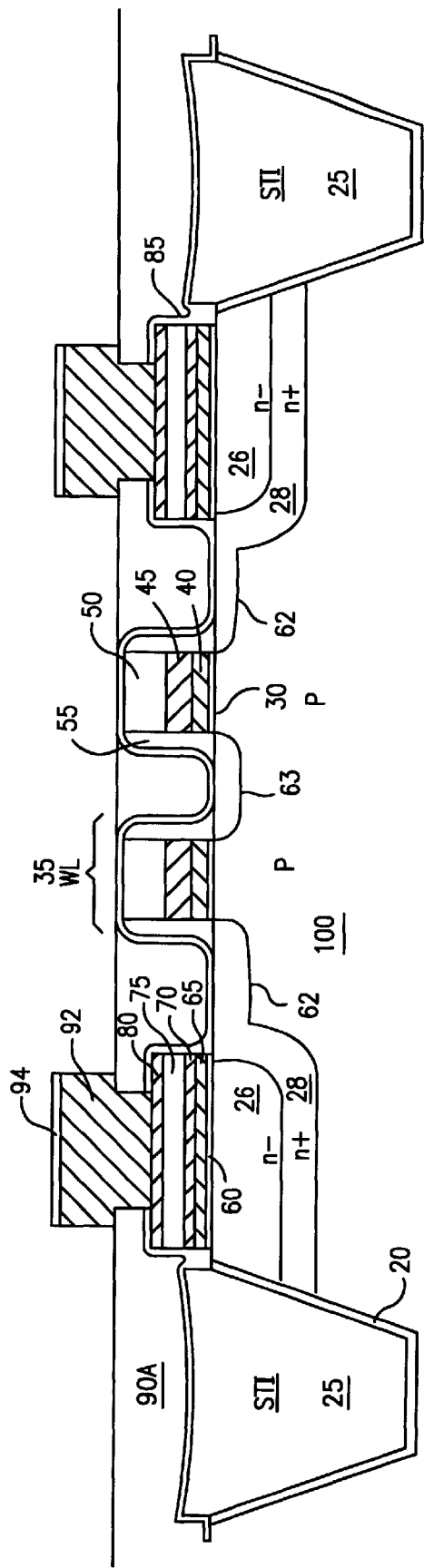

Subsequent to formation, the first bulk insulator layer 90A is planarized, such as by CMP. For one embodiment, the first bulk insulator layer 90A is planarized back to a level of the protective layer 85 above the word lines 35. Due to the small height difference between the word lines 35 and the capacitors, the thickness of the first bulk insulator layer 90A over the capacitors may now be less than approximately 960 Å (in accordance with the foregoing embodiments). The first bulk insulator layer 90A and the protective layer 85 are then patterned to define contact areas to the capacitors. Conductive plate lines are coupled to the top plates of the capacitors through these contact areas to facilitate programming of the capacitors. For one embodiment, the plate lines are formed by forming a conductor layer 92 and an optional cap layer 94 overlying the first bulk insulator layer 90A and the capacitor contact areas. The cap layer 94 may be used to limit diffusion to or from the conductor layer 92 (i.e., as a barrier layer), to improve adhesion of subsequent overlying layers (i.e., as an adhesion layer), or to provide insulation between the conductor layer 92 and overlying layers (i.e., as an insulating layer). The conductor layer 92 and cap layer 94 are then patterned to define the plate lines. For a further embodiment, the conductor layer 92 includes more than one layer of conductive material, e.g., a barrier layer of titanium nitride followed by a metal layer. The metal layer may further include a metal alloy, such as AlCu alloy, and have a thickness of preferably approximately 2000–4000 Å (most preferably approximately 3000 Å). For one embodiment, the cap layer 94 is silicon nitride. Although the plate lines are depicted in FIG. 1C as being parallel to the word lines 35, the plate lines may also be formed orthogonal to the word lines 35.

Figure 1D:
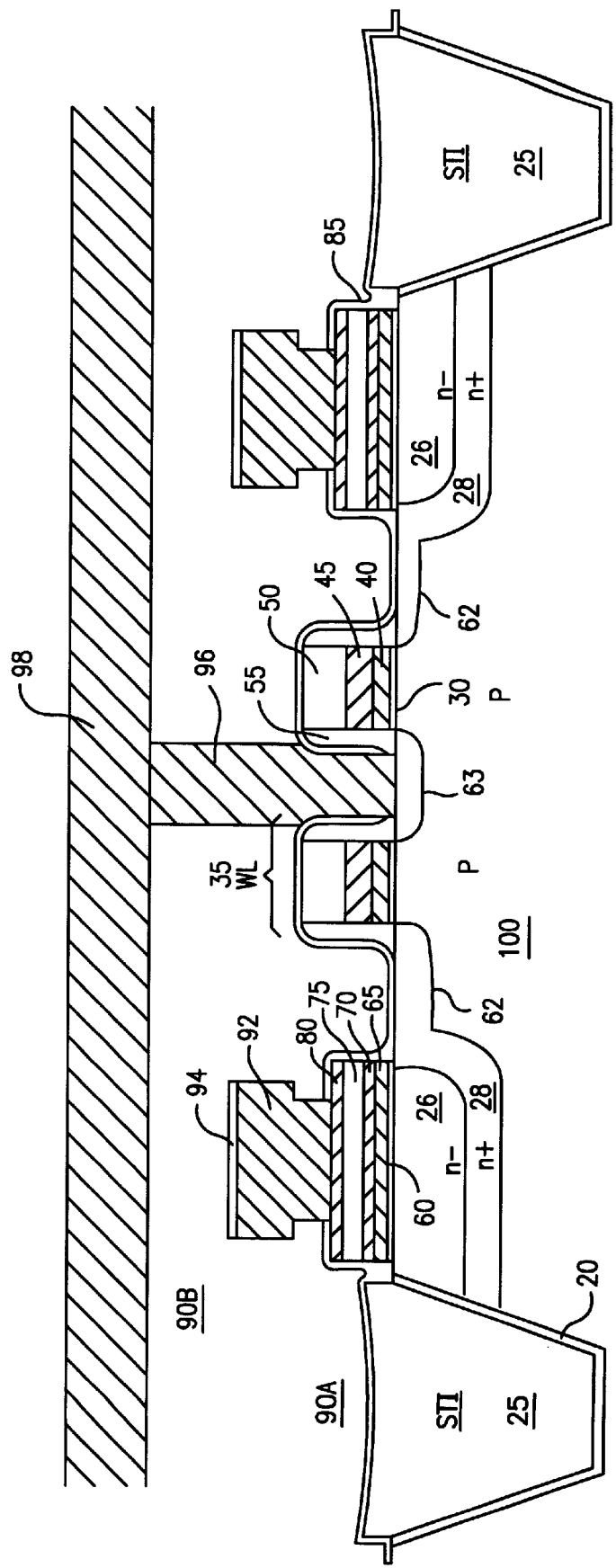

Looking now at FIG. 1D, a second bulk insulator layer 90B is formed overlying the first bulk insulator layer 90A as well as the plate lines, i.e., the conductor layer 92 and the cap layer 94. The second bulk insulator layer 90B is an insulating material. The second bulk insulator layer 90B may contain the same insulating material as the first bulk insulator layer 90A. For one embodiment, the second bulk insulator layer 90B is a silicon oxide formed using CVD with a TEOS precursor to a thickness of preferably approximately 2600–5200 Å (most preferably approximately 4000 Å). The second bulk insulator layer 90B is then planarized, such as by CMP. The thickness of the second bulk insulator layer 90B, especially in the areas above the conductor layer 92, should be of sufficient thickness to provide a workable bit line capacitance in subsequent processing.

The second bulk insulator layer 90B is then patterned to expose areas for future bit line contacts. Portions of the exposed second bulk insulator layer 90B, the underlying first bulk insulator layer 90A, and the protective layer 85 are removed, forming recesses exposing portions of the wafer 100 for the bit line contacts at the source/drain region 63 shared by the word lines 35. Removal of portions of the exposed second bulk insulator layer 90B, the underlying first bulk insulator layer 90A, and the protective layer 85 may include etching the second bulk insulator layer 90B, the underlying first bulk insulator layer 90A, and the protective layer 85. A contact plug 96 is then formed in the recess overlying the source/drain region 63. The contact plug 96 contains a conductive material to provide electrical communication to the source/drain region 63. For one embodiment, the contact plug 96 is a conductively-doped polysilicon. For a further embodiment, the contact plug 96 is formed by blanket depositing a layer of n-type polysilicon, planarizing the polysilicon to the surface of the second bulk insulator layer 90B, and using an etch-back process to form a recessed polysilicon plug.

A bit line 98 is formed overlying the second bulk insulator layer 90B and the contact plug 96. Bit lines 98 are coupled to columns of memory cells of a memory array. The bit line 98 contains a conductive material. For one embodiment, the bit line 98 contains a metal. For another embodiment, the bit line 98 contains a metal alloy. For a further embodiment, the bit line 98 contains more than one layer of conductive material. For yet another embodiment, the bit line 98 is formed by depositing a layer of tungsten overlying the second bulk insulator layer 90B and the polysilicon contact plug 96, then annealing the layer of tungsten to form tungsten silicide at the interface between the layer of tungsten and the polysilicon contact plug 96. A layer of titanium is then formed overlying the layer of tungsten, and a layer of AlCu alloy is formed overlying the layer of titanium. The one or more layers of conductive material are then patterned to form the bit lines 98.

Shown in FIG. 1E, which is a simplification of FIG. 1D, is a cross-sectional view showing charge conditions in the bottom plate of a capacitor for first and second states of the bi-state ferroelectric memory cells of FIG. 1D. The plate lines, and hence the top plate of each capacitor, are held at a ground potential, such as $V_{SS}$. Capacitor stack 105 is shown in a first state representing a first data value, such as a data value of 1. In the first state, the polarization is such that the FE dielectric layer has a positive potential, and an electron accumulation layer 103 is formed under the first dielectric layer that causes the MOS portion of the capacitor to have a high capacitance value. Stack 107 is shown with the opposite polarization, corresponding to a second state representing a second data value, such as a data value of 0. In the second state, the FE dielectric layer has a negative potential and causes a depletion layer 104 to form, resulting in a low capacitance value for the MOS portion of the capacitor.

Figure 1F:
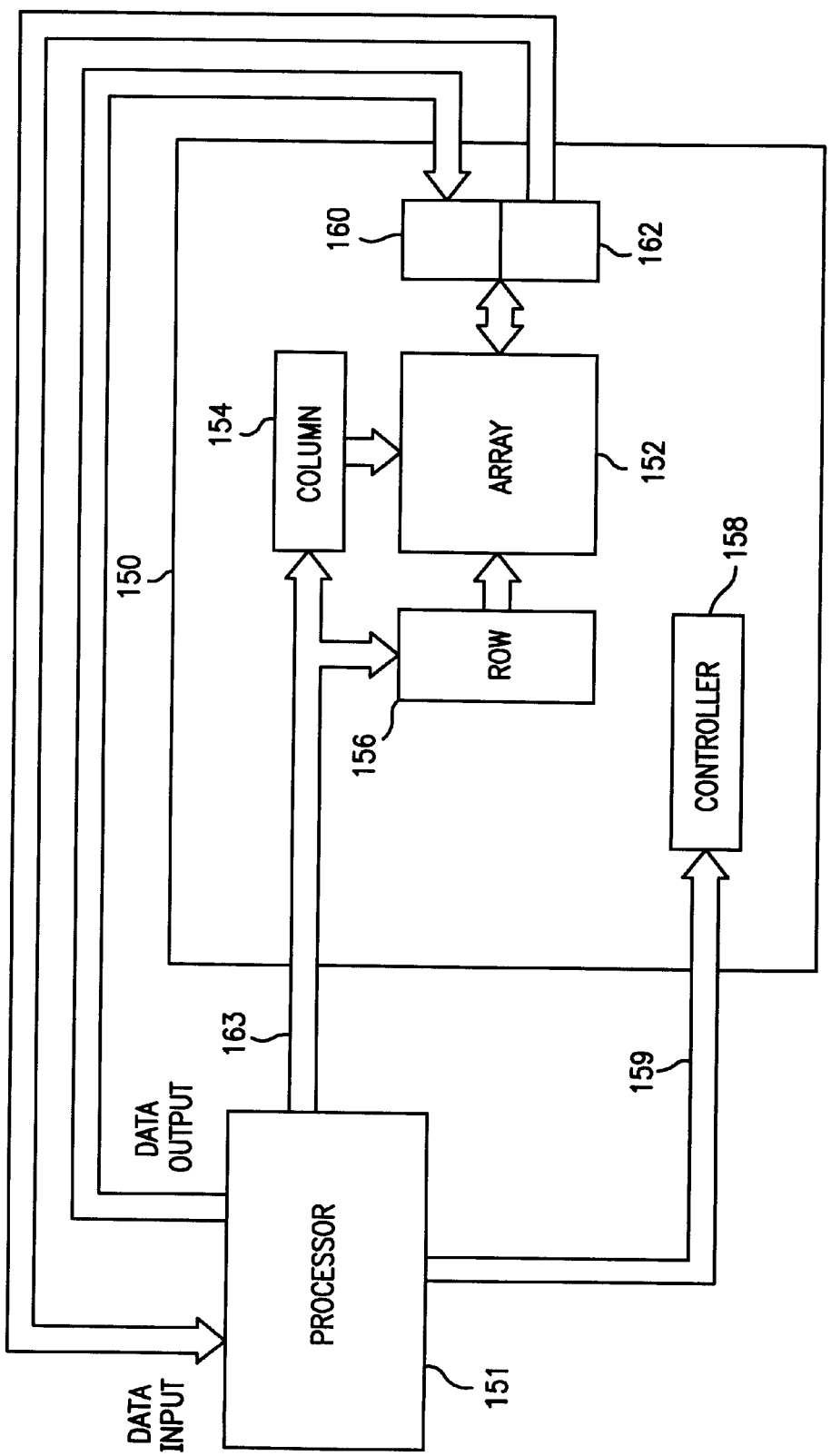
FIG. 1F is a block diagram of a memory device incorporating memory cells in accordance with an embodiment of the invention.

FIG. 1F shows a general block diagram of a memory device 150 incorporating bi-state ferroelectric memory cells in accordance with the various embodiments of the invention. The ferroelectric memory device 150 is coupled to a processor 151 to form an electronic system. The memory device includes a memory array 152, column decoder 154 and row decoder 156, and a control circuit 158. The memory device 150 also includes input 160 and output 162 buffers connected to data input and data output lines, respectively. The data input and output lines can be multiplexed together, but have been illustrated separately for simplicity. Address lines 163 are provided as input to the column decoder 154 and row decoder 156 to address a portion of the memory array 152. The memory array 152 contains the bi-state ferroelectric memory cells of the various embodiments arranged in rows and columns.

In operation, the memory device control circuit 158 responds to control inputs 159 from the processor 151 to control operations performed on the memory array 152. In particular, the control circuit 158 is used to read data from and write data to the memory array 152. During one of these access operations, an address provided on the address lines 163 is decoded by the row decoder 156 to activate a word line, thereby accessing a row of the memory array 152. Likewise, an address provided on the address lines 163 is decoded by the column decoder 154 to activate at least one bit line, thereby accessing at least one column of the memory array 152. An addressed memory cell is located at the intersection between each activated word line and each activated bit line. During a read operation, the data stored in the addressed memory cell(s) is then transferred to the output buffer 162 and provided on the data output lines. In a write operation, the addressed memory cell is accessed and data provided on the data input lines is stored in the cell.

As noted previously, a capacitor stack in accordance with the foregoing embodiments may be thought of as having an FE portion in series with a MOS portion. Its capacitance can thus be estimated according to the formula, $C=(C_{fe}*C_{mos})/(C_{fe}+C_{mos})$ where $C_{fe}$ is the "voltage-dependent" or differential capacitance of the FE portion and $C_{mos}$ is the capacitance of the MOS portion. In the high capacitance, or accumulation, first state, $C_{mos}=C_{accum}\approx 0.5\ C_{fe}$ and $C\approx C_{fe}/3$. In the low capacitance, or depletion, second state, $C_{mos}=C_{deplet}$, where $C_{deplet}$ is the low capacitance of the depletion layer in the silicon. For the cell described above, $C_{deplet}<<C_{fe}$ and $C\approx C_{deplet}<<C_{fe}/3$.

Figure 2A:
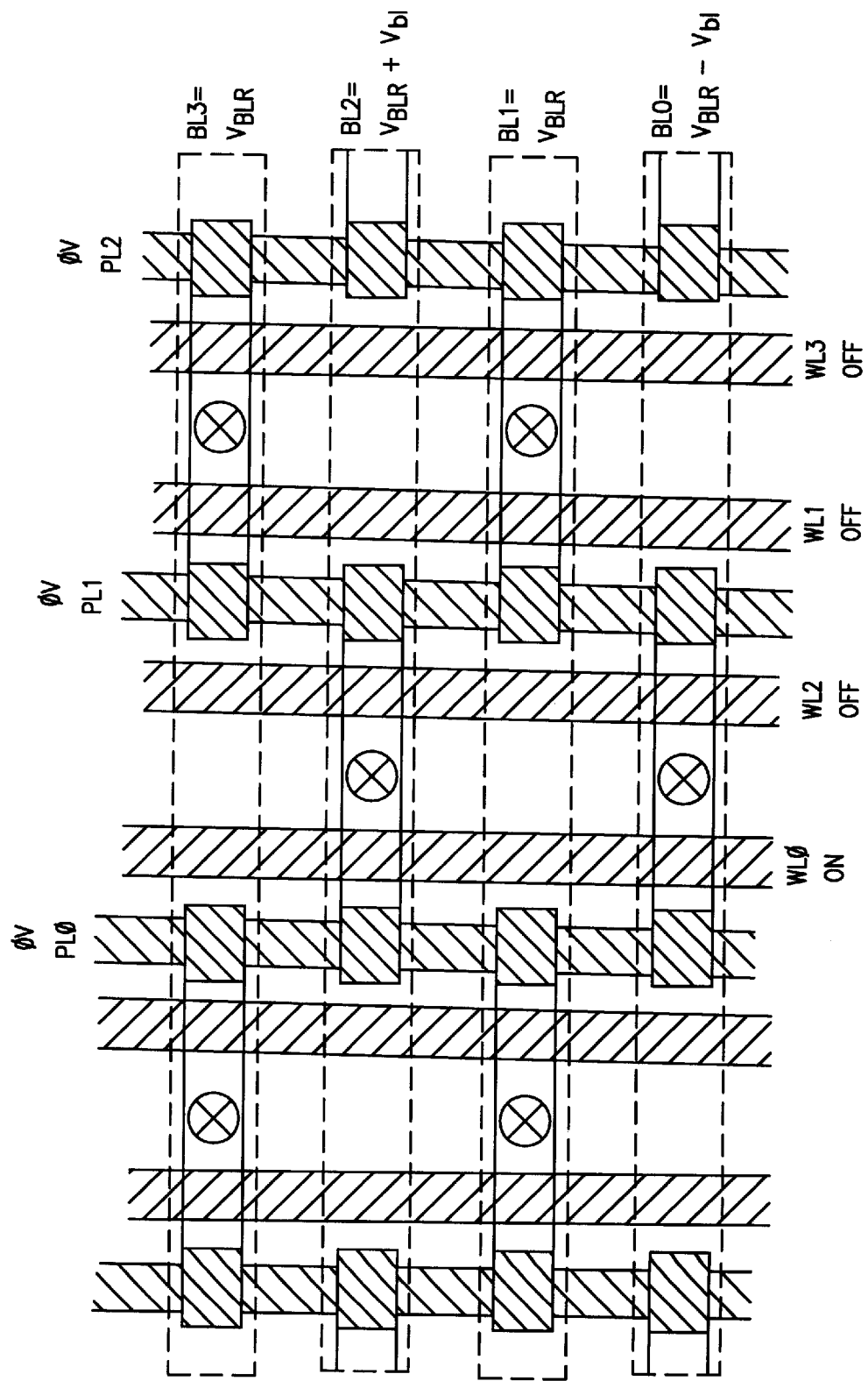
FIG. 2A is a top view of a portion of a memory array showing various voltage states for performing a read operation on a memory cell in accordance with one embodiment of the invention.
Figure 2B:
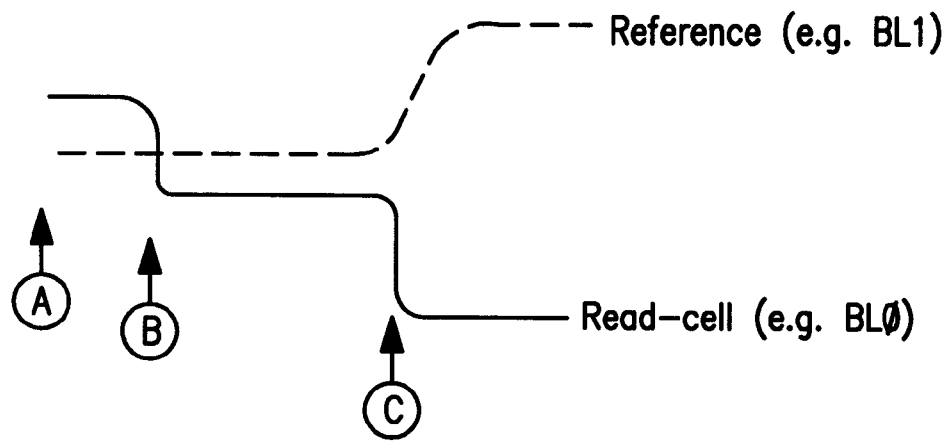
FIG. 2B is a diagram of bit line voltage signals versus time for reading first and second data values.
Figure 2B:
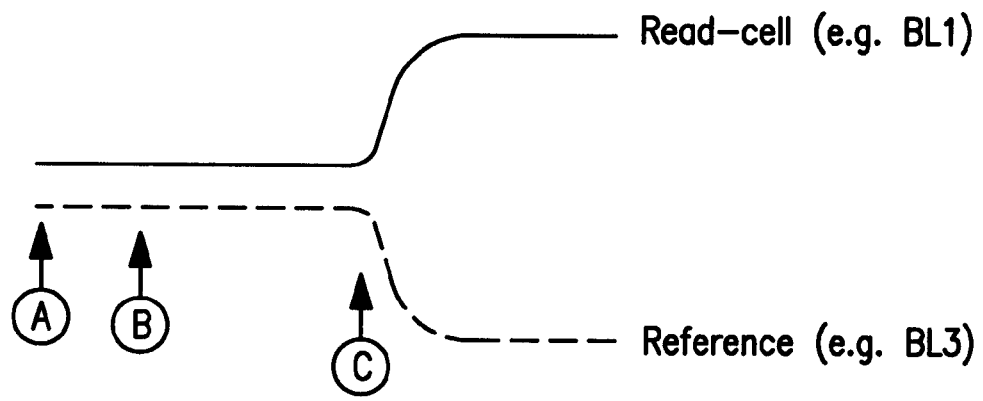

A top view of the array and bias conditions during a read operation are presented in FIG. 2A for two cells along the word line WL0 as a portion of a memory array in accordance with the various embodiments of the invention. In this example, cell X on bit line BL0 is programmed to a high-capacitance first state, and cell Y on BL2 is programmed to a low-capacitance second state. FIG. 2B shows schematically the bit line voltage signals versus time. The read operation includes of the following steps: precharging the bit lines and electrically isolating them (point A), selecting a row or word line (point B), deselecting the row and connecting pairs of bit lines to their respective sense amplifiers (point C). Selecting a row includes activating the pass transistors of the memory cells corresponding to the word line, thereby coupling each associated capacitor to its corresponding bit line. Likewise, deselecting a row includes deactivating the pass transistors of the memory cells corresponding to the word line, thereby decoupling each associated capacitor from its corresponding bit line.

The reference bit lines (BL1 and BL3 in this example) are precharged to a reference bit line potential $V_{blr}$. The sensing bit lines for cells being read (BL0 and BL2 in this example) are precharged to a second potential $V_{blr}+V_{bl}$, i.e., some potential higher than $V_{blr}$. For one embodiment, the reference bit lines are precharged substantially concurrently with the sensing bit lines. For even (odd) numbered column addresses, the memory cells are coupled to even (odd) numbered bit lines. Thus, the odd (even) sets of bit lines can be identified as reference read-cell bit lines and precharged accordingly when the column address is decoded.

When the desired row is selected (point B), cells in the first state pull their bit line potentials down by an amount of approximately $2V_{bl}$, and cells in the second state have a negligible effect on their bit lines. For one embodiment, such as the bi-state FMOS capacitor described with reference to FIGS. 1A–1D, $2V_{bl}\approx 200$ mV. When the cell states are sensed (point C), the potential difference between the read-cell and reference bit lines is approximately $-V_{bl}$ for cells in the first state and approximately $+V_{bl}$ for cells in the second state.

The sense amplifier may include conventional DRAM-type sensing technologies, such as a crossed-pair latch. Such sense amplifiers generally sense and amplify the initial potential difference between the sensing and reference bit lines to a larger rail-to-rail potential difference. The sense amplifier thus drives the lower-potential bit line to the lower power rail, such as the ground potential $V_{SS}$, and the higher-potential bit line to the higher power rail, such as the supply potential $V_{CC}$.

During the read operations, the potential difference across the capacitors (the potential difference between bit lines and plate lines) is approximately equal to $V_{blr}$. $V_{blr}$ is chosen to be some fraction of the programming voltage $V_{pp}$ so the cell polarization state is not disturbed during a read operation. Stated alternatively, the potential difference across the capacitor is below a polarization reversal threshold level. In general, $V_{blr}$ is also chosen such that the sense amplifier having $V_{blr}$ applied to both reference and sensing bit lines would tend to remain in its metastable state until disturbed by a potential difference. For one embodiment, $V_{blr}$ is approximately $V_{CC}/2$. For another embodiment, $V_{blr}$ is approximately $V_{CC}/3$. After the read operations, the word line may again be accessed with the read-cell bit lines held at a ground potential in order to discharge the capacitor.

Figure 3A:
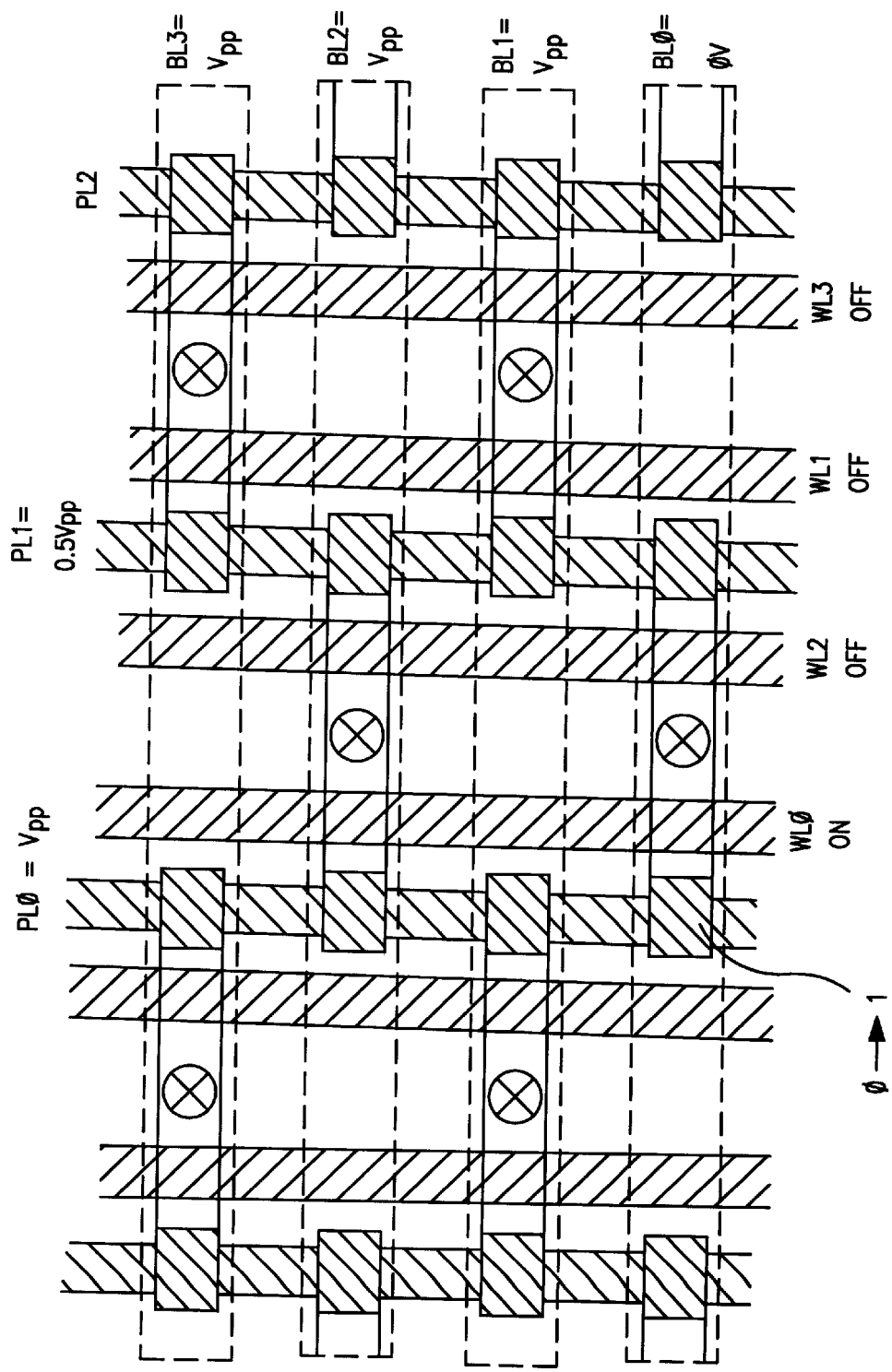
FIG. 3A is a top view of a portion of a memory array showing various voltage states for performing a write operation on a memory cell for a first data value in accordance with one embodiment of the invention.
Figure 3B:
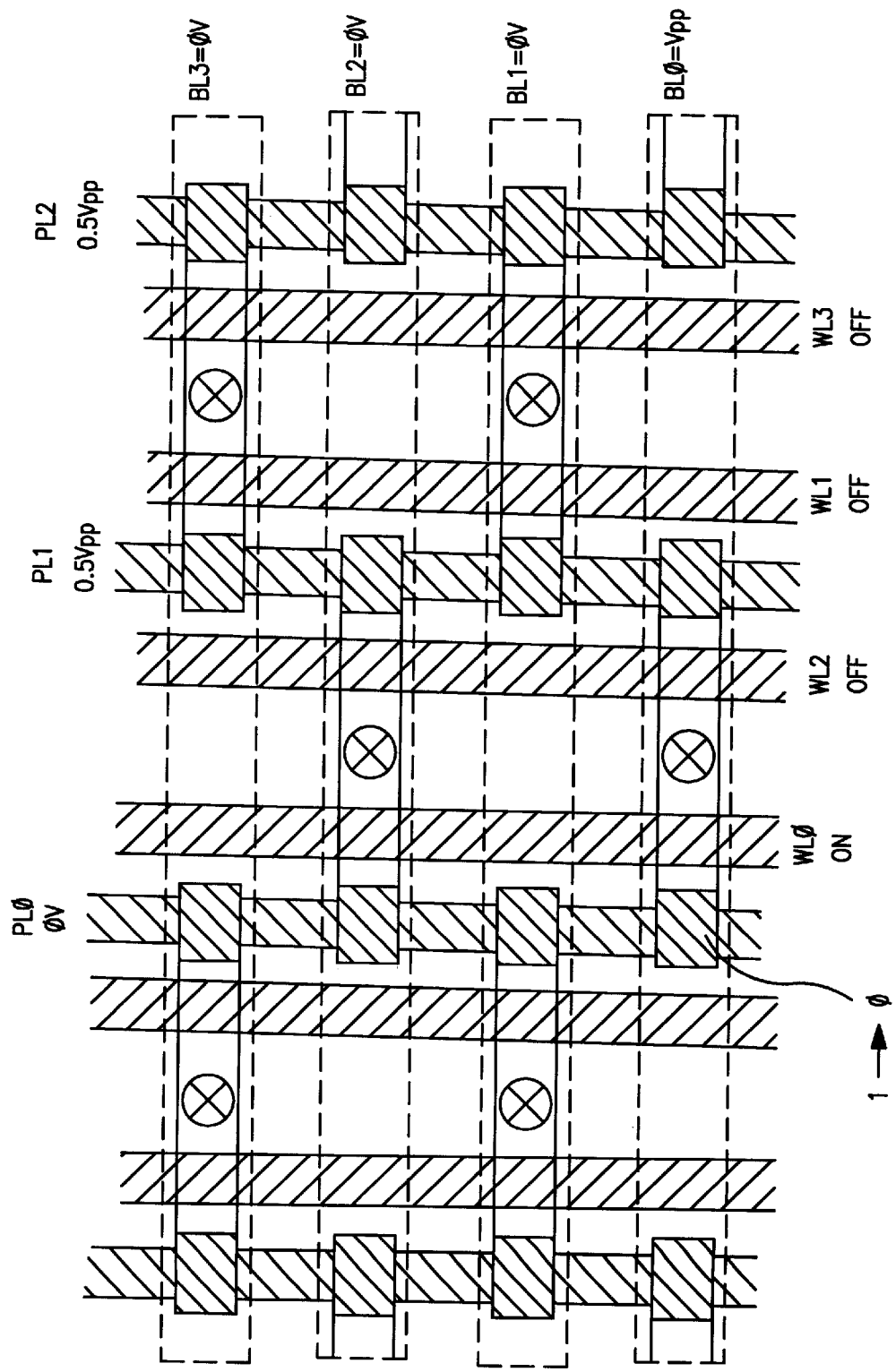
FIG. 3B is a top view of a portion of a memory array showing various voltage states for performing a write operation on a memory cell for a second data value in accordance with one embodiment of the invention.

The bias conditions for the write operation are depicted in FIGS. 3A and 3B, showing portions of a memory array in accordance with the various embodiments of the invention. In both cases, non-selected rows have word lines turned off and plate lines set to some fraction of the programming voltage, such as $0.5V_{pp}$. For programming a first data value, shown in FIG. 3A, the voltage on the selected cell's bit line is set to a ground potential, while the plate line and word line voltages are set to $V_{pp}$ on the selected cell's row. The bit lines of non-selected columns are set to $V_{pp}$. For programming a second data value, shown in FIG. 3B, the selected cell's bit line and word line are set to $V_{pp}$, with the selected cell's plate line at the ground potential. The bit lines of non-selected columns are set to the ground potential. In this manner, the programming voltage is only applied to the cell selected by program line and cell pass transistor, while other cells in the selected row will have no voltage difference applied across their bi-state capacitors.

The programming voltage $V_{pp}$ is approximately equal to the voltage drop across the FE portion of the capacitor, $V_f$, plus the voltage drop across the MOS portion of the capacitor. The value of $V_{pp}$ is thus chosen to produce a $V_f$ sufficient to change the polarization of the FE portion of the capacitor and depends upon the composition and processing history of the ferroelectric material. For one embodiment, $V_{pp}$ is large enough to produce a voltage drop of approximately 2 volts across a SBT FE dielectric layer. For the capacitor as described with reference to FIGS. 1A–1D, the calculated value of $V_{pp}$ is typically less than approximately 5 volts.

Figure 4A:
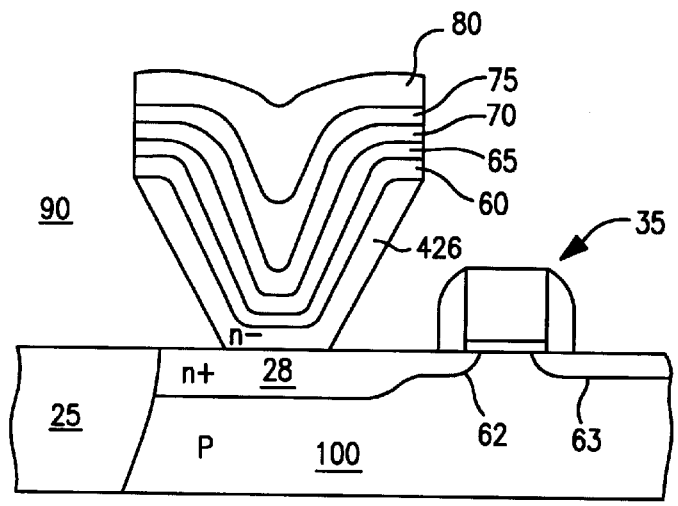
FIG. 4A is a cross-sectional view of a capacitor in accordance with one embodiment of the invention as a container or trench capacitor.
Figure 4B:
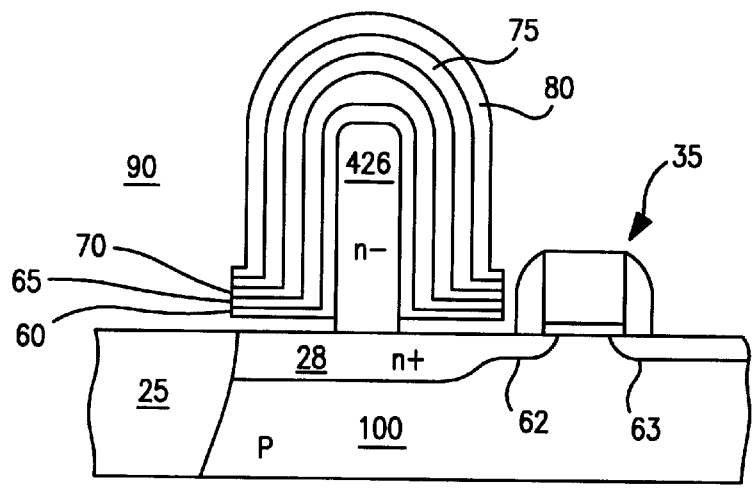
FIG. 4B is a cross-sectional view of a capacitor in accordance with another embodiment of the invention as a plug capacitor.

While a flat, parallel-plate structure has been shown for the capacitor of the foregoing embodiments, the capacitor need not take this form. Other capacitor geometries are known in the art, such as a container or trench capacitor, as generally shown in FIG. 4A, and a plug or pillar capacitor, as generally shown in FIG. 4B. Formation of the various capacitor geometries are well known in the art of integrated circuit fabrication. Accordingly, the various embodiments of the invention are not limited to a specific capacitor geometry.

For the embodiments of FIGS. 4A–4B, the bottom capacitor plate again contains a depletable region and a conductive region. The conductive region, e.g., $n^+$ well 28, provides good electrical communication with the source/drain region 62 of the pass transistor of the memory cell and provides good electrical isolation from the p-type substrate 100. The conductive region is generally a region of high impurity or high conductivity and having a conductivity type opposite the conductivity type of the substrate 100. The depletable region, e.g., $n^-$ layer 426, is generally a region of low impurity or low conductivity to increase the magnitude of the depletion region. The magnitude of the depletion region varies with applied voltage such that the overall capacitance will also vary with applied voltage. The depletable region should also have a conductivity type opposite the conductivity type of the substrate 100.

While both the depletable region and conductive region of the bottom capacitor plate of the capacitor geometry of FIGS. 1A–1D were formed in the substrate 100, only the conductive region of the bottom capacitor plate is formed in the substrate 100 for the capacitor geometries of FIGS. 4A–4B. The depletable region of the bottom capacitor plate, i.e., layer 426, is formed overlying and in contact with the conductive portion, i.e., well 28. There are no interposing dielectric layers between the conductive and depletable regions of the bottom capacitor plate. For one embodiment, layer 426 is a doped polysilicon layer. For another embodiment, layer 426 is a doped epitaxial silicon layer. For the embodiment of FIG. 4A, layer 426 is formed in a trench or recess. The trench or recess is formed in a bulk insulator layer 90 with contact to the conductive region of the bottom capacitor plate. For the embodiment of FIG. 4B, layer 426 is a pillar or ridge formed in contact with the conductive region of the bottom capacitor plate. Formation and properties of the various components of the embodiments of FIGS. 4A–4B may be the same as like components described in reference to FIGS. 1A–1D.

Figure 5:
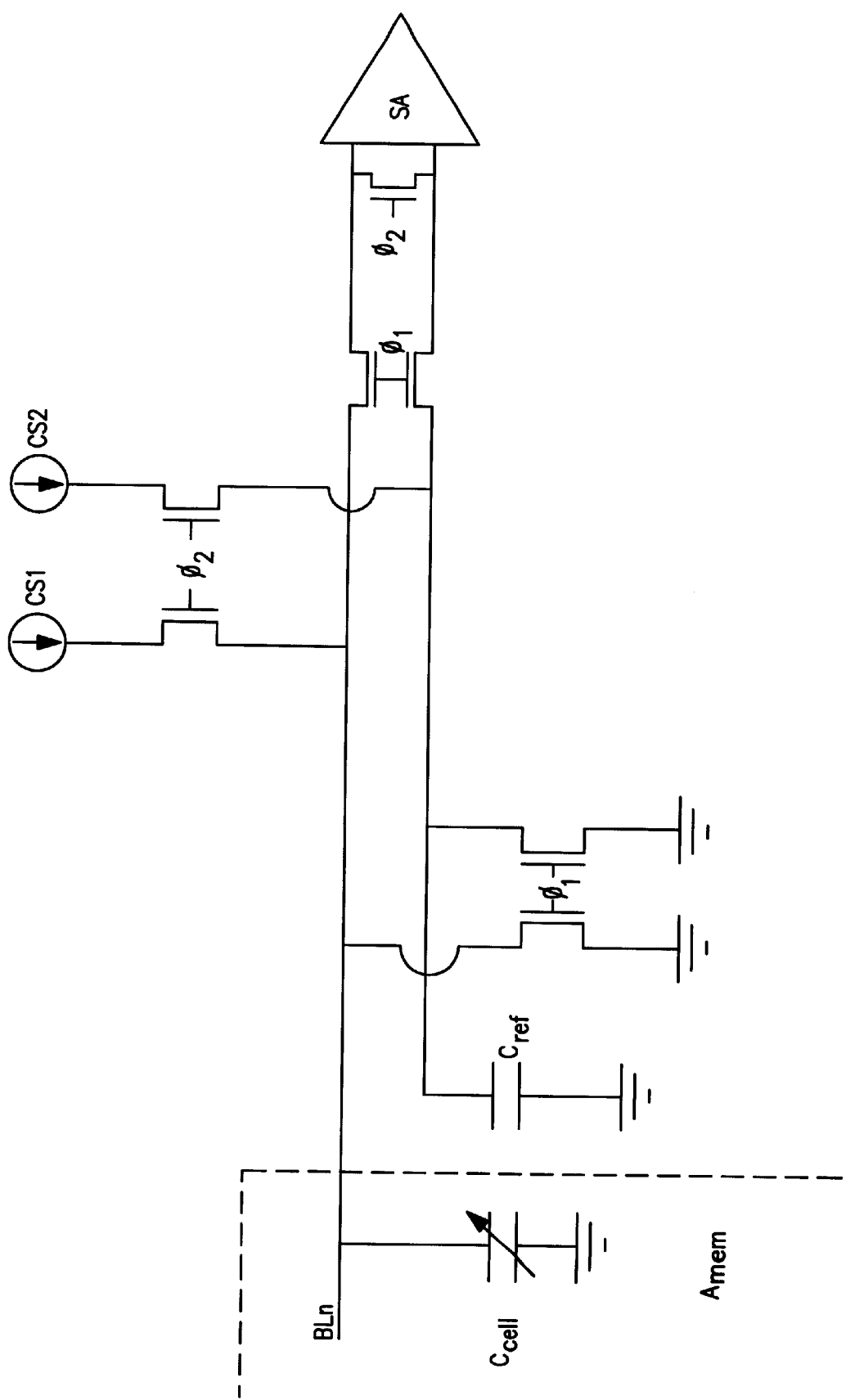
FIG. 5 is a schematic of a sensing circuit for a memory using capacitors in accordance with one embodiment of the invention.
Figure 6:
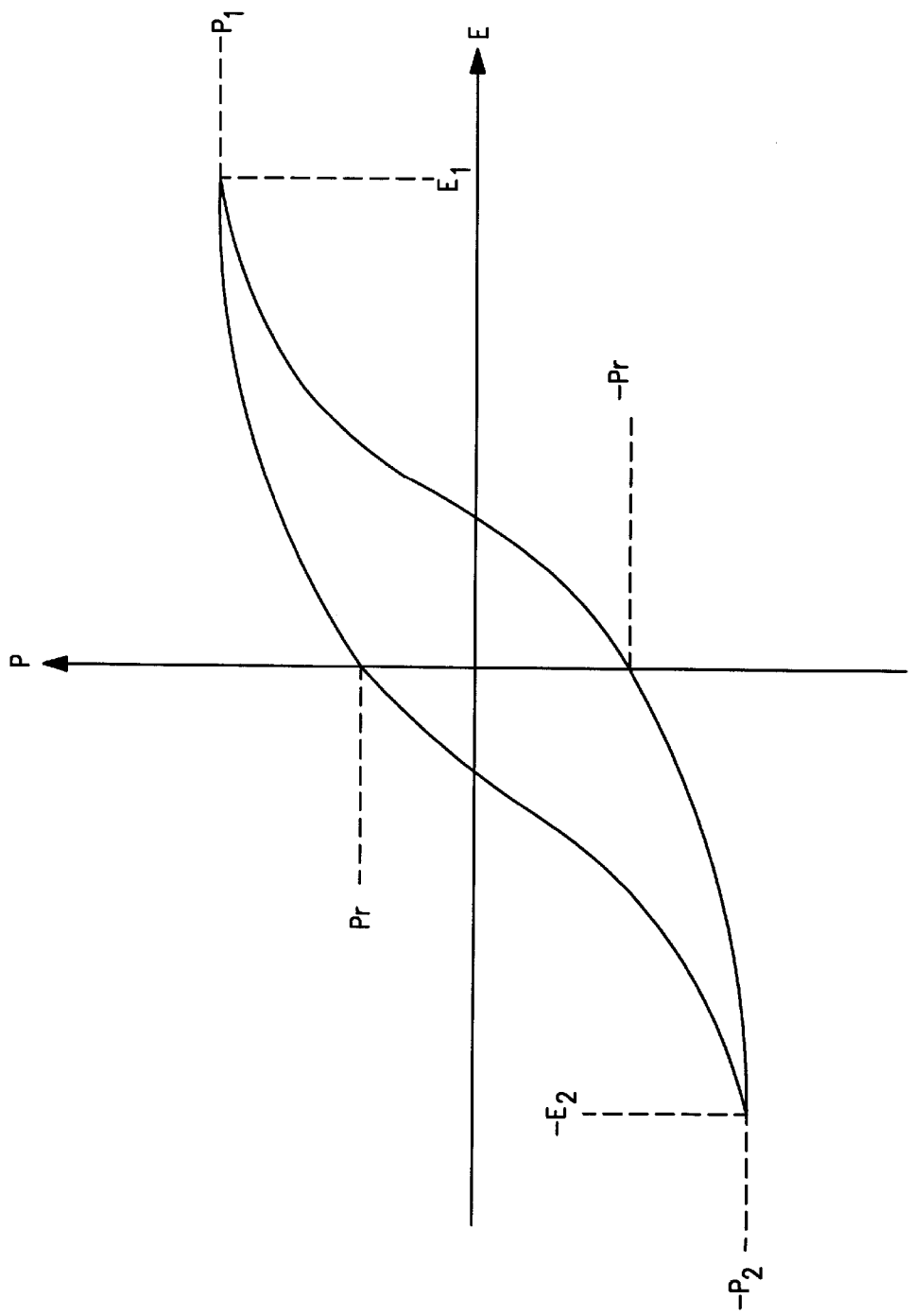
FIG. 6 is a diagram of a typical hysteresis curve for a ferroelectric material.
Figure 7:
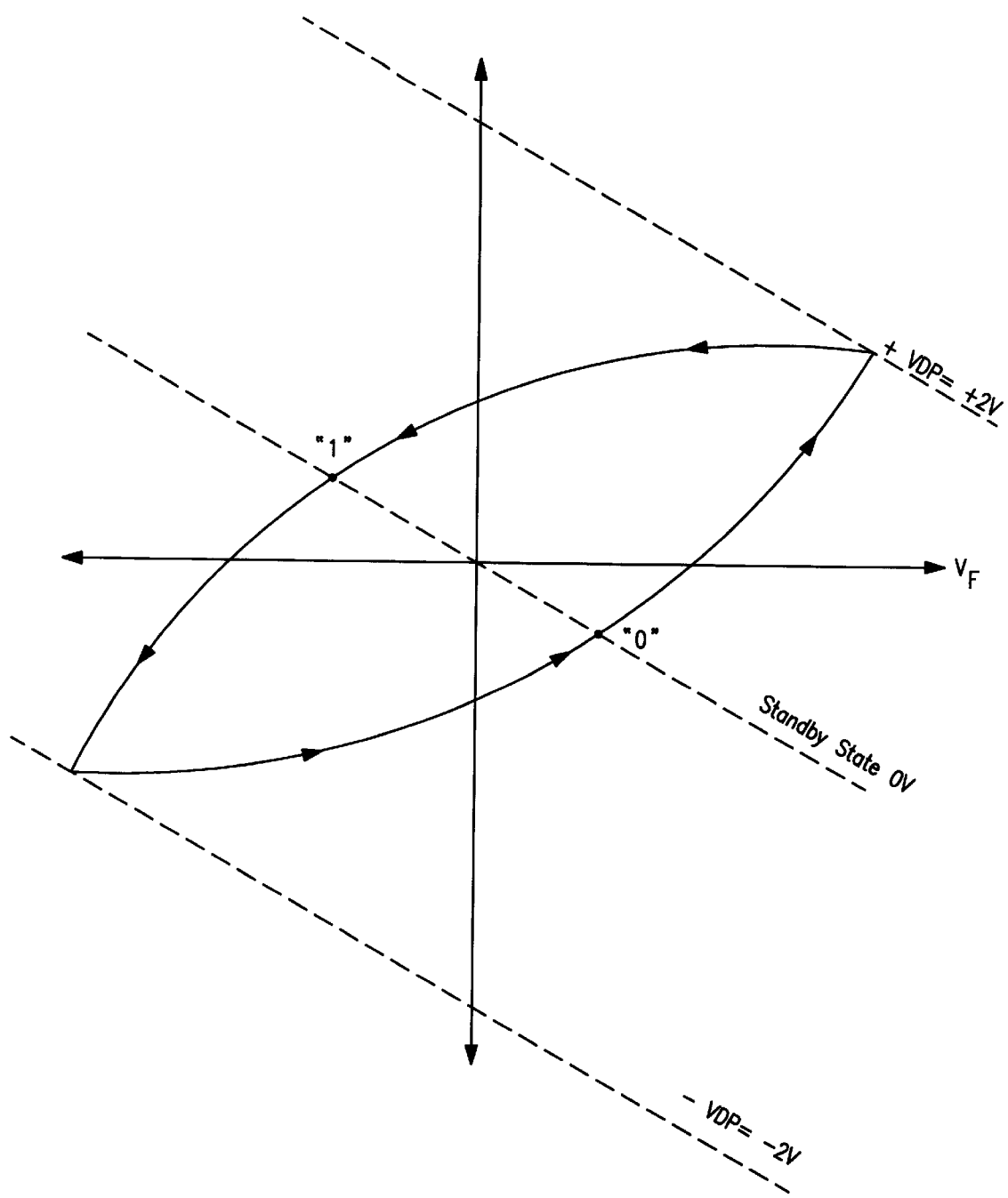
FIG. 7 is a simplified diagram of an expected hysteresis curve for a bi-state ferroelectric capacitor.

FIG. 5 shows an example of an alternate sense amplifier configuration that can be used with a memory array having remanent-polarization-programmable capacitors, i.e., the capacitors of the various embodiments. A selected memory cell $C_{cell}$, on bit line $bl_n$ of array $A_{mem}$, is compared with a reference capacitor $C_{ref}$ on reference bit line $bl_{ref}$ to see which has the greater capacitance value. (The fixed value of the capacitor $C_{ref}$ is selected to provide a good midpoint value that will track the decay in program states.) In a first phase of operation, the transistors shown gated by clock signal $\phi_1$ set both the cell output bit line $bl_n$, and the reference capacitor's terminal to a fixed potential, ground in this case. In a second phase, the capacitors gated by clock signal $\phi_2$ connect two matched current sources $CS_1$ and $CS_2$ to charge up both bit lines for a predetermined period. The current sources $CS_1$ and $CS_2$ should be chosen such that the potential difference across the FE portion of the capacitor does not exceed a polarization reversal threshold level of the FE portion at the end of the predetermined period. During the charging period, an equilibration transistor $M_{eq}$ is also activated to hold the sense amplifier in its metastable state. After the clock signal $\phi_2$ goes low, clock signal $\phi_3$ is brought high. This turns on the pass transistors that connect the differential signal into the conventional sense amplifier.

CONCLUSION

Bi-state ferroelectric-MOS (FMOS) capacitors have been described with specific reference to their use in memory cells. Bi-state ferroelectric memory cells have a bottom plate of a capacitor coupled to a first source/drain region of a pass transistor, a gate of the pass transistor coupled to a word line, and a second source/drain region of the pass transistor coupled to a bit line. The capacitor has a ferroelectric portion. A plate line is coupled to the top plate of the capacitor to facilitate programming of the polarization state of the ferroelectric portion of the capacitor. The polarization state of a ferroelectric portion of the capacitor causes a depletion or accumulation of electrons in the bottom plate of the capacitor, thus altering its capacitance value. The resulting capacitance value may be sensed without causing a polarization reversal of the ferroelectric portion of the capacitor. Accordingly, bi-state ferroelectric memory cells of the various embodiments function as non-volatile memory cells.

While specific dimensions were referred to in the example embodiments, the invention is not limited to the specific dimensions provided. It is recognized that there is a continuing drive to reduce device dimensions in integrated circuit manufacture. Accordingly, the referenced dimensions are intended only as guidelines under current manufacturing practices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, where the ferroelectric material is compatible with the material of the semiconductor substrate or other depletable region, both the first dielectric layer and the intermediate capacitor plate may be eliminated such that the ferroelectric material is overlying and adjoining the depletable region. Accordingly, this application is intended to cover any adaptations or variations of the invention. It is manifestly intended that this invention be limited only by the following claims and equivalents thereof.

What is claimed is:

1. A memory cell, comprising:
   a pass transistor having a gate formed overlying a substrate, a first source/drain region formed in the substrate and a second source/drain region formed in the substrate; and
   a capacitor having a bottom capacitor plate at least a portion of which is formed in the substrate and coupled to the first source/drain region, a first dielectric layer formed overlying the bottom capacitor plate, a ferroelectric dielectric layer formed overlying the first dielectric layer, and a top capacitor plate formed overlying the ferroelectric dielectric layer.

2. The memory cell of claim 1, wherein the substrate is a semiconductor substrate having a first conductivity type, and wherein the first source/drain region and the bottom capacitor plate each have a second conductivity type opposite the first conductivity type.

3. The memory cell of claim 2, wherein the substrate is a p-type silicon substrate and the first source/drain region and the bottom capacitor plate each have an n-type conductivity.

4. The memory cell of claim 1, wherein the bottom capacitor plate further comprises a conductive region formed in the substrate and a depletable region formed in the conductive region.

5. The memory cell of claim 1, wherein the bottom capacitor plate further comprises a conductive region formed in the substrate and a depletable region formed overlying and in contact with the conductive region.

6. The memory cell of claim 1, further comprising an intermediate capacitor plate formed between the first dielectric layer and the ferroelectric dielectric layer.

7. A memory cell, comprising:
   a pass transistor having a gate formed overlying a substrate, a first source/drain region formed in the substrate and a second source/drain region formed in the substrate; and
   a capacitor having a bottom capacitor plate formed in the substrate, a first dielectric layer formed overlying the bottom capacitor plate, a ferroelectric dielectric layer formed overlying the first dielectric layer, and a top capacitor plate formed overlying the ferroelectric dielectric layer;
   wherein the bottom capacitor plate has a low conductivity region formed within a high conductivity region; and
   wherein the high conductivity region of the bottom capacitor plate is coupled to the first source/drain region of the pass transistor.

8. A memory cell, comprising:
   a pass transistor having a gate formed overlying a substrate, a first source/drain region formed in the substrate and a second source/drain region formed in the substrate; and
   a capacitor having a bottom capacitor plate, a first dielectric layer formed overlying the bottom capacitor plate, a ferroelectric dielectric layer formed overlying the first dielectric layer, and a top capacitor plate formed overlying the ferroelectric dielectric layer;
   wherein the bottom capacitor plate has a high conductivity region formed in the substrate and a low conductivity region formed overlying and in contact with the high conductivity region; and
   wherein the high conductivity region of the bottom capacitor plate is coupled to the first source/drain region of the pass transistor.

9. A memory cell, comprising:
   a pass transistor having a gate formed overlying a substrate, a first source/drain region formed in the substrate and a second source/drain region formed in the substrate; and
   a capacitor having a bottom capacitor plate formed in the substrate, a first dielectric layer formed overlying the bottom capacitor plate, a ferroelectric dielectric layer formed overlying the first dielectric layer, and a top capacitor plate formed overlying the ferroelectric dielectric layer;
   wherein the bottom capacitor plate has a depletable region formed within a conductive region; and
   wherein the conductive region of the bottom capacitor plate is coupled to the first source/drain region of the pass transistor.

10. A memory cell, comprising:
    a pass transistor having a gate formed overlying a substrate, a first source/drain region formed in the substrate and a second source/drain region formed in the substrate; and
    a capacitor having a bottom capacitor plate, a first dielectric layer formed overlying the bottom capacitor plate, a ferroelectric dielectric layer formed overlying the first dielectric layer, and a top capacitor plate formed overlying the ferroelectric dielectric layer;
    wherein the bottom capacitor plate has a conductive region formed in the substrate and a depletable region formed overlying and in contact with the conductive region; and
    wherein the conductive region of the bottom capacitor plate is coupled to the first source/drain region of the pass transistor.

11. A memory cell, comprising:
    a pass transistor having a gate formed overlying a silicon substrate of a first conductivity type, a first source/drain region of a second conductivity type formed in the silicon substrate and a second source/drain region of the second conductivity type formed in the silicon substrate, wherein the second conductivity type is opposite the first conductivity type; and a capacitor having a bottom capacitor plate formed in the silicon substrate, a first dielectric layer formed overlying the bottom capacitor plate, a ferroelectric dielectric layer formed overlying the first dielectric layer, and a top capacitor plate formed overlying the ferroelectric dielectric layer;

wherein the bottom capacitor plate has a first region formed within a second region;

wherein the first region of the bottom capacitor plate is doped to the second conductivity type at a first dopant concentration; and wherein the second region of the bottom capacitor plate is coupled to the first source/drain region of the pass transistor and is doped to the second conductivity at a second dopant concentration, the second dopant concentration being higher than the first dopant concentration.

12. The memory cell of claim 11, wherein the first dopant concentration is approximately $10^{17}$–$10^{19}$ atoms/cm$^3$.

13. The memory cell of claim 12, wherein the second dopant concentration is greater than the first dopant concentration by at least approximately one order of magnitude.

14. A memory cell, comprising:

a pass transistor having a gate formed overlying a silicon substrate of a first conductivity type, a first source/drain region of a second conductivity type formed in the silicon substrate and a second source/drain region of the second conductivity type formed in the silicon substrate, wherein the second conductivity type is opposite the first conductivity type; and a capacitor having a bottom capacitor plate, a first dielectric layer formed overlying the bottom capacitor plate, a ferroelectric dielectric layer formed overlying the first dielectric layer, and a top capacitor plate formed overlying the ferroelectric dielectric layer;

wherein the bottom capacitor plate has a first region overlying and in contact with a second region;

wherein the second region of the bottom capacitor plate is formed in the substrate;

wherein the first region of the bottom capacitor plate is doped to the second conductivity type at a first dopant concentration; and wherein the second region of the bottom capacitor plate is coupled to the first source/drain region of the pass transistor and is doped to the second conductivity at a second dopant concentration, the second dopant concentration being higher than the first dopant concentration.

15. A memory cell, comprising:

a pass transistor having a gate formed overlying a semiconductor substrate of a first conductivity type, a first source/drain region of a second conductivity type formed in the semiconductor substrate, and a second source/drain region of the second conductivity type formed in the semiconductor substrate, wherein the second conductivity type is opposite the first conductivity type; and a capacitor having a bottom capacitor plate of the second conductivity type formed in the semiconductor substrate and coupled to the first source/drain region, a first dielectric layer formed overlying the bottom capacitor plate, an intermediate capacitor plate formed overlying the first dielectric layer, a ferroelectric dielectric layer formed overlying the intermediate capacitor plate, and a top capacitor plate formed overlying the ferroelectric dielectric layer.

16. The memory cell of claim 15, wherein the first conductivity type is a p-type conductivity and the second conductivity type is an n-type conductivity.

17. The memory cell of claim 15, wherein the intermediate capacitor plate further comprises a first conductive layer coupled to the first dielectric layer and a second conductive layer coupled to the ferroelectric dielectric layer.

18. The memory cell of claim 17, wherein the second conductive layer acts as a barrier layer to inhibit interaction between the ferroelectric dielectric layer and the bottom capacitor plate.

19. A memory cell, comprising:

a pass transistor having a gate formed overlying a semiconductor substrate of a first conductivity type, a first source/drain region of a second conductivity type formed in the semiconductor substrate, and a second source/drain region of the second conductivity type formed in the semiconductor substrate, wherein the second conductivity type is opposite the first conductivity type; and a capacitor, wherein the capacitor comprises:
    a bottom capacitor plate of the second conductivity type, at least a portion of which is formed in the semiconductor substrate and coupled to the first source/drain region;
    a first dielectric layer formed overlying the bottom capacitor plate;
    a first conductive layer formed overlying the first dielectric layer;
    a conductive barrier layer formed overlying the first conductive layer;
    a ferroelectric dielectric layer formed overlying the conductive barrier layer; and
    a top capacitor plate formed overlying the ferroelectric dielectric layer.

20. A memory cell, comprising:

a pass transistor having a gate formed overlying a p-type silicon substrate, a first n-type source/drain region formed in the p-type silicon substrate, and a second n-type source/drain region formed in the p-type silicon substrate; and a capacitor, wherein the capacitor comprises:
    a bottom capacitor plate formed in the p-type silicon substrate, wherein the bottom capacitor plate includes an n$^-$ well formed within a n$^+$ well and wherein the n$^+$ well is coupled to the first n-type source/drain region;
    a first dielectric layer formed overlying the bottom capacitor plate, wherein the first dielectric layer contains a dielectric material selected from the group consisting of silicon oxides, silicon nitrides and silicon oxynitrides;
    a conductively-doped polysilicon layer formed overlying the first dielectric layer;
    a first metal barrier layer formed overlying the conductively-doped polysilicon layer;
    a ferroelectric dielectric layer formed overlying the first metal barrier layer; and
    a second metal barrier layer formed overlying the ferroelectric dielectric layer, wherein the second metal barrier layer functions as a top capacitor plate.

21. A memory device, comprising:

an array of memory cells, wherein each memory cell comprises:

a pass transistor having a gate formed overlying a substrate, a first source/drain region formed in the substrate and a second source/drain region formed in the substrate; and a capacitor having a bottom capacitor plate coupled to the first source/drain region, a first dielectric layer formed overlying the bottom capacitor plate, a ferroelectric dielectric layer formed overlying the first dielectric layer, and a top capacitor plate formed overlying the ferroelectric dielectric layer, wherein at least a portion of the bottom capacitor plate is formed in the substrate;

a plurality of word lines coupled to rows of memory cells of the array of memory cells;

a plurality of bit lines coupled to columns of memory cells of the array of memory cells;

a row decoder coupled to the array of memory cells; and a column decoder coupled to the array of memory cells.

22. A memory device, comprising:

an array of memory cells, wherein each memory cell comprises:

a pass transistor having a gate formed overlying a substrate, a first source/drain region formed in the substrate and a second source/drain region formed in the substrate; and a capacitor having a bottom capacitor plate formed in the substrate, a first dielectric layer formed overlying the bottom capacitor plate, a ferroelectric dielectric layer formed overlying the first dielectric layer, and a top capacitor plate formed overlying the ferroelectric dielectric layer;

wherein the bottom capacitor plate has a low conductivity region formed within a high conductivity region; and wherein the high conductivity region of the bottom capacitor plate is coupled to the first source/drain region of the pass transistor;

a plurality of word lines coupled to rows of memory cells of the array of memory cells;

a plurality of bit lines coupled to columns of memory cells of the array of memory cells;

a row decoder coupled to the array of memory cells; and a column decoder coupled to the array of memory cells.

23. A memory device, comprising:

an array of memory cells, wherein each memory cell comprises:

a pass transistor having a gate formed overlying a substrate, a first source/drain region formed in the substrate and a second source/drain region formed in the substrate; and a capacitor having a bottom capacitor plate, a first dielectric layer formed overlying the bottom capacitor plate, a ferroelectric dielectric layer formed overlying the first dielectric layer, and a top capacitor plate formed overlying the ferroelectric dielectric layer;

wherein the bottom capacitor plate has a high conductivity region formed in the substrate and a low conductivity region; and wherein the high conductivity region of the bottom capacitor plate is coupled to the first source/drain region of the pass transistor;

a plurality of word lines coupled to rows of memory cells of the array of memory cells;

a plurality of bit lines coupled to columns of memory cells of the array of memory cells;

a row decoder coupled to the array of memory cells; and a column decoder coupled to the array of memory cells.

24. The memory device of claim 23, wherein the low conductivity region of the bottom capacitor plate is formed within the high conductivity region.

25. The memory device of claim 23, wherein the low conductivity region of the bottom capacitor plate is formed overlying and in contact with the high conductivity region.

26. A memory device, comprising:

an array of memory cells, wherein each memory cell comprises:

a pass transistor having a gate formed overlying a substrate, a first source/drain region formed in the substrate and a second source/drain region formed in the substrate; and a capacitor having a bottom capacitor plate formed in the substrate, a first dielectric layer formed overlying the bottom capacitor plate, a ferroelectric dielectric layer formed overlying the first dielectric layer, and a top capacitor plate formed overlying the ferroelectric dielectric layer;

wherein the bottom capacitor plate has a depletable region formed within a conductive region; and wherein the conductive region of the bottom capacitor plate is coupled to the first source/drain region of the pass transistor;

a plurality of word lines coupled to rows of memory cells of the array of memory cells;

a plurality of bit lines coupled to columns of memory cells of the array of memory cells;

a row decoder coupled to the array of memory cells; and a column decoder coupled to the array of memory cells.

27. A memory device, comprising:

an array of memory cells, wherein each memory cell comprises:

a pass transistor having a gate formed overlying a silicon substrate of a first conductivity type, a first source/drain region of a second conductivity type formed in the silicon substrate and a second source/drain region of the second conductivity type formed in the silicon substrate, wherein the second conductivity type is opposite the first conductivity type; and a capacitor having a bottom capacitor plate formed in the silicon substrate, a first dielectric layer formed overlying the bottom capacitor plate, a ferroelectric dielectric layer formed overlying the first dielectric layer, and a top capacitor plate formed overlying the ferroelectric dielectric layer;

wherein the bottom capacitor plate has a first region formed within a second region;

wherein the first region of the bottom capacitor plate is doped to the second conductivity type at a first dopant concentration; and wherein the second region of the bottom capacitor plate is coupled to the first source/drain region of the pass transistor and is doped to the second conductivity at a second dopant concentration, the second dopant concentration being higher than the first dopant concentration;

a plurality of word lines coupled to rows of memory cells of the array of memory cells;

a plurality of bit lines coupled to columns of memory cells of the array of memory cells;

a row decoder coupled to the array of memory cells; and a column decoder coupled to the array of memory cells.

28. A memory device, comprising:

an array of memory cells, wherein each memory cell comprises:
- a pass transistor having a gate formed overlying a semiconductor substrate of a first conductivity type, a first source/drain region of a second conductivity type formed in the semiconductor substrate, and a second source/drain region of the second conductivity type formed in the semiconductor substrate, wherein the second conductivity type is opposite the first conductivity type; and
- a capacitor having a bottom capacitor plate of the second conductivity type at least a portion of which is formed in the semiconductor substrate and coupled to the first source/drain region, a first dielectric layer formed overlying the bottom capacitor plate, an intermediate capacitor plate formed overlying the first dielectric layer, a ferroelectric dielectric layer formed overlying the intermediate capacitor plate, and a top capacitor plate formed overlying the ferroelectric dielectric layer;

a plurality of word lines coupled to rows of memory cells of the array of memory cells;

a plurality of bit lines coupled to columns of memory cells of the array of memory cells;

a row decoder coupled to the array of memory cells; and a column decoder coupled to the array of memory cells.

29. A memory device, comprising:

an array of memory cells, wherein each memory cell comprises:
- a pass transistor having a gate formed overlying a p-type silicon substrate, a first n-type source/drain region formed in the p-type silicon substrate, and a second n-type source/drain region formed in the p-type silicon substrate; and
- a capacitor, wherein the capacitor comprises:
  - a bottom capacitor plate formed in the p-type silicon substrate, wherein the bottom capacitor plate includes an $n^-$ well formed within a $n^+$ well and wherein the $n^+$ well is coupled to the first n-type source/drain region;
  - a first dielectric layer formed overlying the bottom capacitor plate, wherein the first dielectric layer contains a dielectric material selected from the group consisting of silicon oxides, silicon nitrides and silicon oxynitrides;
  - a conductively-doped polysilicon layer formed overlying the first dielectric layer;
  - a first metal barrier layer formed overlying the conductively-doped polysilicon layer;
  - a ferroelectric dielectric layer formed overlying the first metal barrier layer; and
  - a second metal barrier layer formed overlying the ferroelectric dielectric layer, wherein the second metal barrier layer functions as a top capacitor plate;

a plurality of word lines coupled to rows of memory cells of the array of memory cells;

a plurality of bit lines coupled to columns of memory cells of the array of memory cells;

a row decoder coupled to the array of memory cells; and a column decoder coupled to the array of memory cells.

30. An electronic system, comprising:

a processor; and a memory device coupled to the processor, wherein the memory device comprises:
- an array of memory cells, wherein each memory cell comprises:
  - a pass transistor having a gate formed overlying a substrate, a first source/drain region formed in the substrate and a second source/drain region formed in the substrate; and
  - a capacitor having a bottom capacitor plate at least a portion of which is formed in the substrate and coupled to the first source/drain region, a first dielectric layer formed overlying the bottom capacitor plate, a ferroelectric dielectric layer formed overlying the first dielectric layer, and a top capacitor plate formed overlying the ferroelectric dielectric layer;
- a plurality of word lines coupled to rows of memory cells of the array of memory cells;
- a plurality of bit lines coupled to columns of memory cells of the array of memory cells;
- a row decoder coupled to the array of memory cells; and
- a column decoder coupled to the array of memory cells.

31. A memory cell, comprising:

a pass transistor having a gate formed overlying a substrate, a first source/drain region formed in the substrate and a second source/drain region formed in the substrate; and a capacitor having a bottom capacitor plate at least a portion of which is formed in the substrate and coupled to the first source/drain region, a first dielectric layer formed overlying the bottom capacitor plate, a ferroelectric dielectric layer formed overlying and adjoining the first dielectric layer, and a top capacitor plate formed overlying the ferroelectric dielectric layer.

32. A memory cell, comprising:

a pass transistor having a gate formed overlying a substrate, a first source/drain region formed in the substrate and a second source/drain region formed in the substrate; and a capacitor having a bottom capacitor plate at least a portion of which is formed in the substrate and coupled to the first source/drain region, a ferroelectric dielectric layer formed overlying and adjoining the bottom capacitor plate, and a top capacitor plate formed overlying the ferroelectric dielectric layer.

* * * * *